United States Patent [19]

Georger

[11] Patent Number: 5,363,068
[45] Date of Patent: Nov. 8, 1994

[54] AUTOTRANSFORMER CAPABLE OF PASSING A DC SIGNAL AS WELL AS A BALANCED OUTPUT SIGNAL

[75] Inventor: William H. Georger, Township of Dover, Ocean County, N.J.

[73] Assignee: AT&T Bell Laboratories, Murray Hill, N.J.

[21] Appl. No.: 84,041

[22] Filed: Jun. 28, 1993

[51] Int. Cl.⁵ .......................... H03H 5/00; H03H 7/38
[52] U.S. Cl. .......................................... 333/25; 333/32
[58] Field of Search ................... 333/25, 26, 32, 1, 4, 333/5, 27; 340/870.31, 870.32, 870.35, 870.36

[56] References Cited

U.S. PATENT DOCUMENTS

| | | |
|---|---|---|
| 3,731,237 | 5/1973 | Beurrier . |
| 4,717,896 | 1/1988 | Graham ................................. 333/25 |
| 4,823,095 | 4/1989 | Atallah et al. ......................... 333/27 |
| 4,885,747 | 12/1989 | Foglia . |
| 5,010,399 | 4/1991 | Goodman et al. . |
| 5,130,793 | 7/1992 | Bordry et al. . |
| 5,172,413 | 12/1992 | Bradley et al. . |

OTHER PUBLICATIONS

*Systimax® Premises Distribution System Components Guide*, AT&T Doc. No. 3726C, (Dec. 1990), pp. 3-10.
U.S. Patent Application of Georger and Rutkowski, Ser. No. 07/943,664, filed Sep. 11, 1992.
U.S. Patent Application of Georger, Ser. No. 08/037,944, filed Mar. 26, 1993.

*Primary Examiner*—Mark P. Powell
*Assistant Examiner*—Cheryl Cohen
*Attorney, Agent, or Firm*—Lester H. Birnbaum

[57] ABSTRACT

Disclosed is a series tuned resonant autotransformer which passes baseband video signals so that more than one non-synchronized channel can be sent over unshielded twisted pair wires sharing a common cable sheath. The transformer includes a trifilar winding configuration with a capacitor, resistor and ground connection coupled between the two secondary windings. The transformer is able to pass a DC signal as well as a balanced output signal over most of the video bandwidth.

7 Claims, 2 Drawing Sheets

AUTOTRANSFORMER CAPABLE OF PASSING A DC SIGNAL AS WELL AS A BALANCED OUTPUT SIGNAL

BACKGROUND OF THE INVENTION

This invention relates to the transmission of baseband video signals.

A need exists to bring baseband video signals to the desk in office environments, for example, to provide security monitoring, factory production monitoring and video conferencing. Such information needs usually require the installation of shielded wiring or optical fiber cables. It would be more economical to utilize wiring which is already available within the physical structure, i.e., unshielded twisted pair cables used for transmission of analog voice signals in the telephone system. Such a video transmission is offered, for example, in AT&T's Systimax ® Premises Distribution System. (See, e.g.,*Systimax ® Premises Distribution System Components Guide*, AT&T Doc. No. 3726C (Dec. 1990).)

Recent proposals have suggested transmitting composite baseband video signals over a twisted wire pair using active components to compensate for phase delays. (See, e.g., U.S. Pat. No. 5,130,793 issued to Bordry et al. and U.S. Pat. No. 5,172,413 issued to Bradley et al.)

It would appear to be more economical to couple video signals onto twisted wire pairs using "passive" rather than "active" components as described, for example, in U.S. patent application of Georger and Rutkowski, Ser. No. 07/943,644, filed Sept. 11, 1992, and U.S. patent application of Georger, Ser. No. 08/037,944, filed Mar. 26, 1993.

Transmission of more than one non-synchronized video channel over corresponding twisted wire pairs which share the same cable sheath presents particular problems in the amount of induced electrostatic field crosstalk which can develop between adjacent pairs due to the unbalanced voltage condition established by the video signals. A passive coupling approach would necessitate use of a transformer to balance the signals. However, such a transformer would also be required to pass a DC signal which is present at the low end of the video bandwidth.

U.S. Pat. No. 3,731,237 issued to Beurrier suggests use of an autotransformer including a trifilar winding for transmission of broadband signals. However, the transformer cannot pass DC signals.

U.S. Pat. No. 4,885,747 issued to Foglia uses transformers with three windings to couple a broadband video signal and baseband data signal onto shielded twisted pair cables. The baseband portion of the design utilizes a common-mode choke which by its nature does not balance the voltage portion of the signal. Only the current portion is balanced thus reducing the amount of crosstalk due to the magnetostatic field but not the electrostatic field.

U.S. Pat. No. 5,010,399 issued to Goodman et al. uses a transformer with three windings to modulate a baseband video signal so it can share the same twisted wire pair as the voice signals.

It does not appear, however, that the prior an has taught how to passively couple non-synchronized baseband video signals onto separate twisted wire pairs which share a common cable sheath.

SUMMARY OF THE INVENTION

The invention is an autotransformer comprising a primary winding and at least two secondary windings wrapped around a common core. A capacitor in parallel with a resistor is coupled between the two secondary windings. A ground connection is also provided between the secondary windings and to one end of the capacitor and resistor. Output leads are coupled to opposite ends of the secondary windings to provide a balanced output voltage for video signals above a predetermined frequency.

BRIEF DESCRIPTION OF THE DRAWING

These and other features of the invention are delineated in detail in the following description. In the drawing.

It will be appreciated that, for purposes of illustration, these figures are not necessarily drawn to scale.

DETAILED DESCRIPTION

Figure 1:
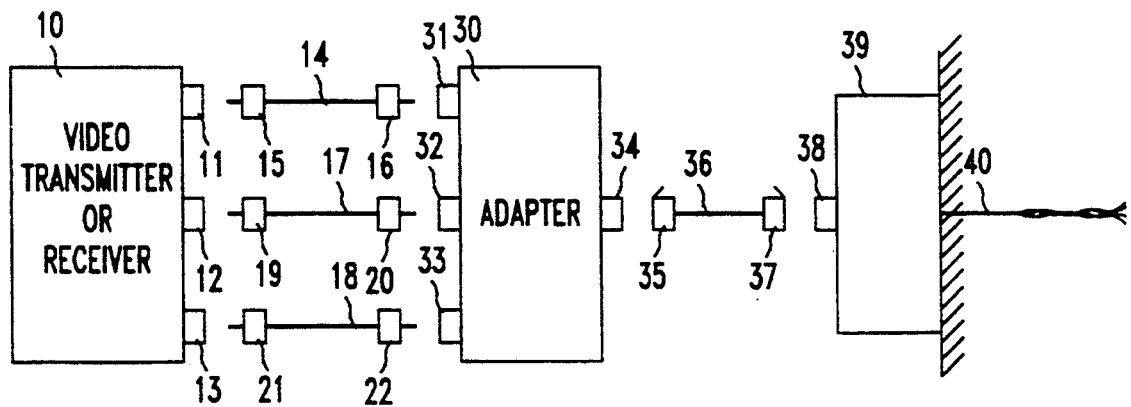
FIG. 1 is a block diagram of a system including the invention in accordance with one embodiment.

FIG. 1 illustrates the use of a device in accordance with the invention to permit transmission of a plurality of non-synchronized video channels, three in this example, over separate twisted wire pairs included within a single cable sheath. A video transmitter or receiver 10 generates or receives three analog baseband video channels at the inputs/outputs 11, 12 and 13. Each input/output 11, 12 and 13 is electrically coupled to a corresponding standard coaxial cable 14, 17 and 18, respectively.

Each coaxial cable is terminated by standard BNC plugs. Thus, cable 14 is terminated by plugs 15 and 16, cable 17 is terminated by plugs 19 and 20, and cable 18 is terminated by plugs 21 and 22.

An adapter 30 includes a first set of ports, 31, 32 and 33, which are standard receptacles for receiving and electrically engaging the plugs 16, 20 and 22 of the cables 14, 17 and 18. At the other end of the adapter is an output port, in this example, a single modular jack 34, which is adapted for receiving and electrically engaging a standard modular plug 35. That is, the modular jack 34 includes at least three pairs of electrical pins, each pair coupled to one of the input ports, 31-33. In this example, a standard 8-pin modular jack is employed.

Cord 36, which can be a standard unshielded twisted pair cord containing at least three twisted pairs, includes standard plugs 35 and 37 at opposite ends. Plug 35 mates with jack 34 of the adapter. The plug 37 mates with a modular jack 38 which is part of the information outlet 39 mounted to the wall of a building. This information outlet couples the video signals onto separate twisted pairs of a four-pair cable, 40, which runs through the building. The information outlet 39 is a standard part of an AT&T Systimax ® Premises Distribution System. (See, for example, *Systimax ® Premises Distribution System Components Guide*, AT&T Doc. No. 3726C (Dec. 1990), p. 3–10.)

Figure 2:
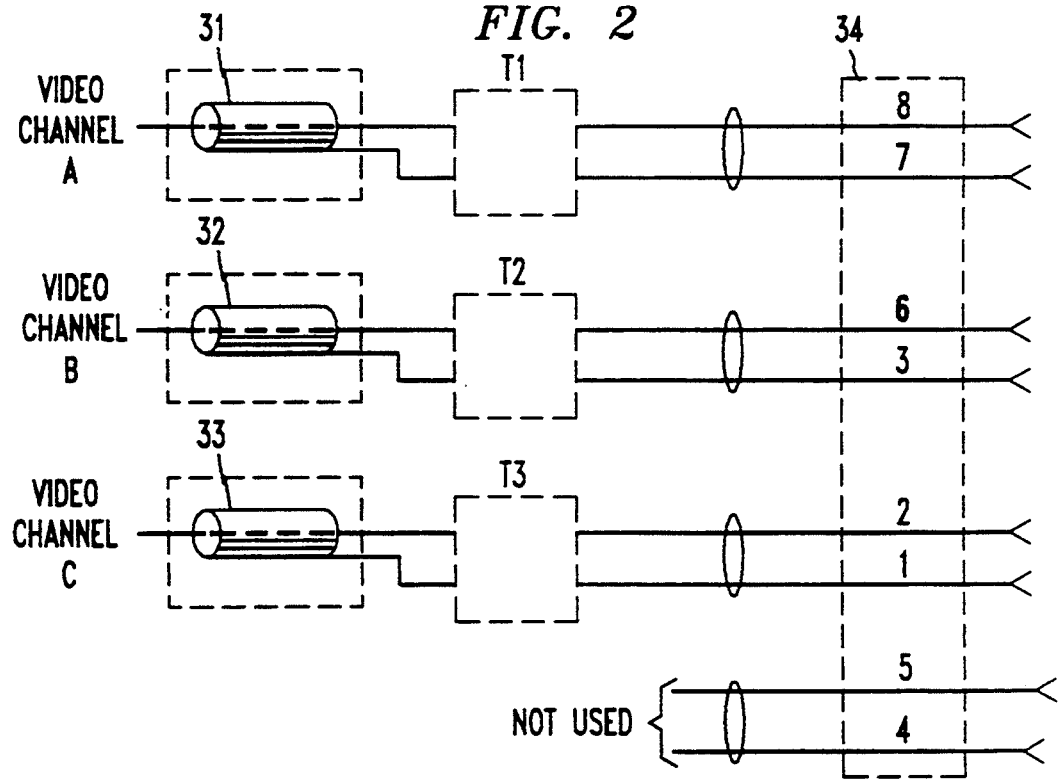
FIG. 2 is a schematic circuit diagram of a device in accordance with the same embodiment which is part of the system of FIG. 1.

The adapter 30 is shown in more detail in the circuit schematic diagram of FIG. 2. The ports 31, 32 and 33, which each receive a separate video channel designated channels A, B and C, respectively, comprise in this embodiment standard BNC female coaxial connectors. However, any suitable connectors could be employed. The signal portion of the connector 31 is coupled to one end of the primary winding of a first transformer, $T_1$, while the ground portion of the connector is coupled to one end of the secondary winding of transformer $T_1$. The opposite ends of the windings are coupled to the appropriate pins (7 and 8) of the modular jack 34.

Similarly, the signal portion of connector 32 is coupled to one end of the primary winding of a second transformer, $T_2$, while the ground connection of connector 32 is coupled to one end of the secondary winding of the second transformer $T_2$. The opposite ends of the windings of transformer $T_2$ are coupled to the appropriate pins (6 and 3) of the modular jack. In like manner, the signal portion of connector 33 is coupled to one end of the primary winding of a third transformer, $T_3$, while the ground connection is coupled to one end of the secondary winding of transformer $T_3$. The opposite ends of the windings of transformer $T_3$ are also coupled to the appropriate pins (2 and 1) of the modular jack 34. Pins 4 and 5 of the modular jack are not employed in this embodiment.

Figure 3:
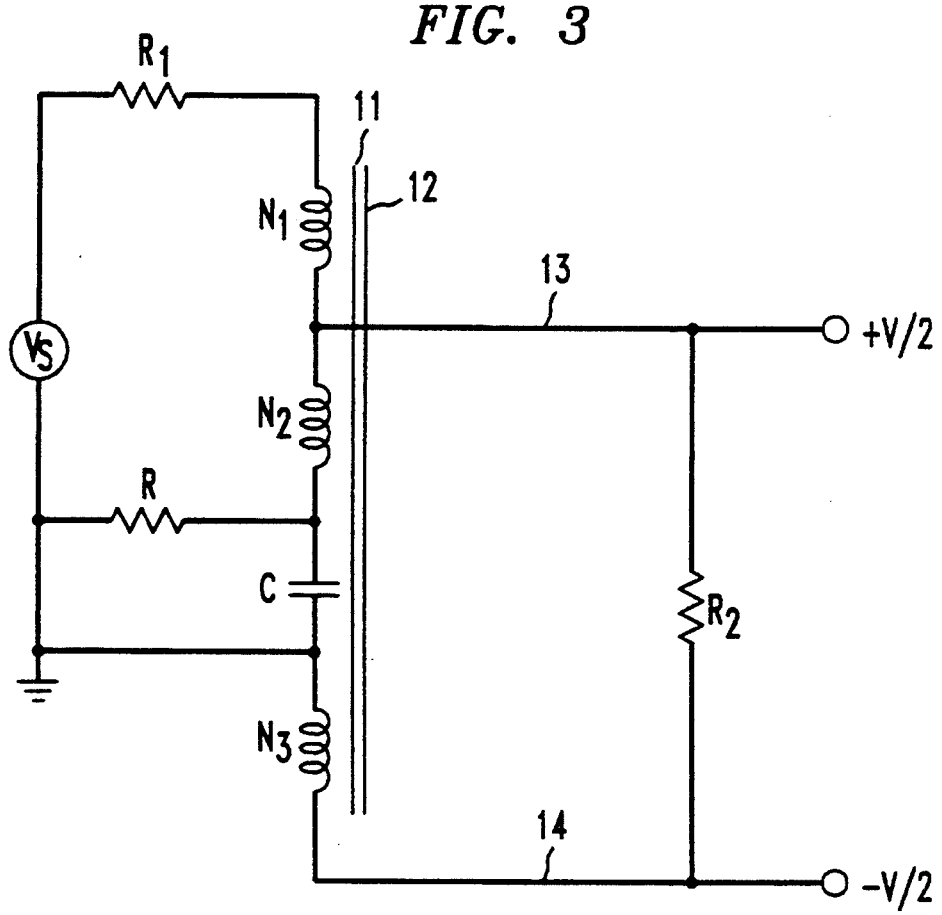
FIG. 3 is a schematic circuit diagram of a portion of the device of FIG. 2 in accordance with the same embodiment.

The autotransformers $T_1$, $T_2$ and $T_3$ can all be identical and, in accordance with the invention, each has the configuration illustrated in the schematic diagram of FIG. 3. As shown, each transformer includes three windings, labeled $N_1$, $N_2$ and $N_3$. Windings $N_1$ and $N_2$ make up the primary winding while windings $N_2$ and $N_3$ make up the secondary winding (i.e., winding $N_2$ is common to both primary and secondary windings). In accordance with known principles of autotransformers, the windings are coupled in series and formed around a single magnetic core, illustrated by the vertical lines 11 and 12. One end of the primary winding $N_1$ is coupled to the incoming video signals represented by source $V_S$. The resistor $R_1$ coupled between the video source and the primary winding represents the impedance of the source and, in this example, is approximately 75 ohms. The other end of the $N_1$ winding is coupled to one end of the winding $N_2$, and is also coupled to a conductor 13 coupled to one output of the transformer.

The opposite end of the winding $N_2$ is coupled to one end of a capacitor C in parallel with a resistor R. The other end of the capacitor C and resistor R is coupled to ground and to one end of the secondary winding $N_3$. The opposite end of winding $N_3$ is coupled to conductor 14 which is coupled to another output of the transformer.

The resistance $R_2$ coupled between conductors 13 and 14 represents the impedance of the twisted pair cable (40 of FIG. 1) and is typically 100 ohms.

Figure 4:
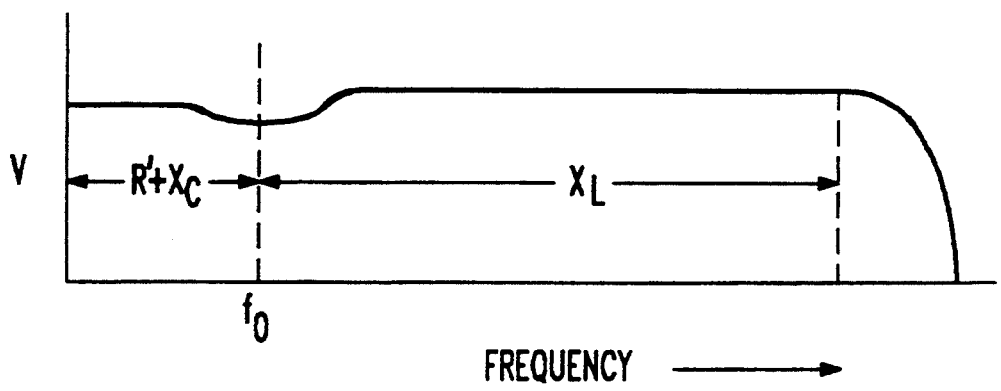
FIG. 4 is a graph illustrating the output of the circuit of FIG. 3 as a function of frequency.

The operation of the autotransformer will now be described with further reference to FIG. 4 which shows the output (in terms of voltage, V) of the autotransformer as a function of frequency (f). It will be noted that the output can be split into two portions. The portion below the series resonant frequency ($f_o$) is labeled $R'+X_c$ since the impedance of the capacitor and the resistance ($R'$) of the resistor R controls the output, while the portion above $f_o$ is labeled $X_L$ since the impedance of the inductors (windings) controls the output signal. Thus, for DC inputs, capacitor C will act as an open circuit and the resistor R will serve as a voltage divider that results in a DC signal being passed to the output on conductor 13. For frequencies above $f_o$, however, the output of the transformer will appear as a balanced output ($+V/2$, $-V/2$) on conductors 13 and 14 since $N_2$ and $N_3$ have an equal number of windings and the ground connection is placed symmetrically between the two windings $N_2$ and $N_3$. At these higher frequencies, C will act as a short circuit, effectively shorting out R.

The series resonant frequency $f_o$ is determined by the open circuit inductance L of the primary windings $N_1$ and $N_2$, and the capacitance $C'$ of the capacitor C according to the equation:

$$f_o = \frac{1}{2\pi \sqrt{L \cdot C}} \quad (1)$$

The Q (quality factor) of this series resonant circuit is also determined by L and $C'$ as well as $R'$ (the resistance of resistor R) according to the equation:

$$Q = \frac{\omega_o L[1 + (\omega_o R'C')^2]}{R'} \quad (2)$$

Preferably, the resonant frequency $f_o$ should be set as low in frequency as possible so that the major portion of the bandwidth (portion $X_L$) is balanced. Ideally, $f_o$ should be less than 15.75 kHz which is the frequency of the horizontal sync pulses.

It will also be noted that the number of turns for the primary winding $N_1$ can be chosen to match the video source impedance ($R_1$) with the cable impedance ($R_2$). Since the output is balanced over most of the bandwidth and the impedances are matched, there will be minimal crosstalk between the various video channels even though they are transmitted on twisted wire pairs which share the same cable sheath.

In a typical example according to the principles described above, $N_1$ was 27 turns, and $N_2$ and $N_3$ were 37 turns each. The capacitance ($C'$) of the capacitor C was 4.7 microfarad. The resonant frequency $f_o$ was 212 Hz. For general application, the value of $C'$ should be in the range 1.0 to 4.7 microfarad and the value of $R'$ should be in the range of 200 to 400 ohms.

It is also desirable to have a high permeability material for the core so that more inductance per turn can be achieved. In general, the permeability should be at least 50,000. This will both improve the high frequency response by minimizing interwinding capacitance, and reduce the overall physical size of the autotransformer.

Various modifications of the invention will become apparent to those skilled in the art. All such variations which basically rely on the teachings through which the invention has advanced the art are properly considered within the scope of the invention.

I claim:

1. A device comprising:
   a primary winding wrapped around a core;
   at least two secondary windings wrapped around the same core;
   the primary and secondary windings being electrically coupled in series;
   a capacitor in parallel with a resistor coupled between adjacent electrically connected ends of the two secondary windings;

a ground connection coupled to one end of the capacitor and resistor and one of said electrically connected ends of one of the secondary windings; and output leads coupled to ends of the secondary windings opposite to the electrically connected ends to provide a balanced output voltage for video signals above a predetermined frequency.

2. The device according to claim 1 wherein the capacitance of the capacitor is within the range 1.0 to 4.7 microfarad and the resistance of the resistor is within the range of 200 to 400 ohms.

3. The device according to claim 1 wherein the predetermined frequency is less than 15.75 kHz.

4. The device according to claim 1 wherein the permeability of the core is at least 50,000.

5. The device according to claim 1 wherein the number of windings in the primary winding is such as to provide an impedance match between a video source and a twisted pair wire cable.

6. The device according to claim 1 wherein the output of the device is adapted for coupling to a twisted pair wire cable.

7. A system for coupling a plurality of separate channels of baseband video signals onto a cable including a corresponding plurality of twisted wire pairs, said system including separate autotransformers electrically coupled to the separate channels and to corresponding ones of the twisted wire pairs, each autotransformer comprising:

a primary winding wrapped around a core;

at least two secondary windings around the same core, the primary and secondary windings being electrically coupled in series;

a capacitor in parallel with a resistor coupled between adjacent electrically connected ends of the two secondary windings;

a ground connection coupled to one end of the capacitor and resistor and one of said electrically connected ends of one of the secondary windings; and output leads coupled to ends of the secondary windings opposite to the electrically connected ends to provide a balanced output voltage for video signals above a predetermined frequency.

* * * * *